United States Patent
Childress et al.

(10) Patent No.: US 8,803,262 B2
(45) Date of Patent: Aug. 12, 2014

(54) DIE ATTACH STRESS ISOLATION

(75) Inventors: Marcus A. Childress, Farmington, MN (US); Nghia T. Dinh, Burnsville, MN (US); James C. Golden, Afton, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 207 days.

(21) Appl. No.: 13/351,482

(22) Filed: Jan. 17, 2012

(65) Prior Publication Data
US 2013/0181303 A1 Jul. 18, 2013

(51) Int. Cl.
*G01P 15/08* (2006.01)

(52) U.S. Cl.
USPC .................... 257/417; 257/E29.324

(58) Field of Classification Search
USPC ........................................ 257/417
See application file for complete search history.

(56) References Cited

U.S. PATENT DOCUMENTS

| | | | |
|---|---|---|---|
| 4,790,192 A * | 12/1988 | Knecht et al. | 73/721 |
| 5,550,373 A * | 8/1996 | Cole et al. | 250/338.1 |
| 5,656,856 A * | 8/1997 | Kweon | 257/686 |
| 6,392,144 B1 * | 5/2002 | Filter et al. | 174/535 |
| 6,635,509 B1 * | 10/2003 | Ouellet | 438/106 |
| 6,768,196 B2 | 7/2004 | Harney et al. | |
| 7,037,805 B2 | 5/2006 | DCamp et al. | |
| 7,170,140 B2 | 1/2007 | Dutoit et al. | |
| 7,370,530 B2 | 5/2008 | DCamp et al. | |
| 7,642,611 B2 * | 1/2010 | Tsuji et al. | 257/414 |
| 7,736,931 B1 | 6/2010 | Guo | |
| 2010/0284553 A1 * | 11/2010 | Conti et al. | 381/174 |
| 2013/0328179 A1 * | 12/2013 | Kim et al. | 257/669 |

* cited by examiner

*Primary Examiner* — Matthew Landau
*Assistant Examiner* — Igwe U Anya
(74) *Attorney, Agent, or Firm* — Edwards Wildman Palmer LLP; Scott D. Wofsy; Joshua L. Jones

(57) ABSTRACT

A microstructure device package includes a package housing configured and adapted to house a microstructure device. A bracket is housed in the package housing. The bracket includes a bracket base with a first bracket arm and a second bracket arm each extending from the bracket base. A channel is defined between the first and second bracket arms. The first bracket aim defines a first mounting surface facing inward with respect to the channel. The second bracket aim defines a second mounting surface facing outward with respect to the channel. The second mounting surface of the bracket is mounted to the package housing. A microstructure device is mounted to the first mounting surface in the channel. The bracket is configured and adapted to isolate the microstructure device from packaging stress imparted from the package housing on the second mounting surface of the bracket.

18 Claims, 5 Drawing Sheets

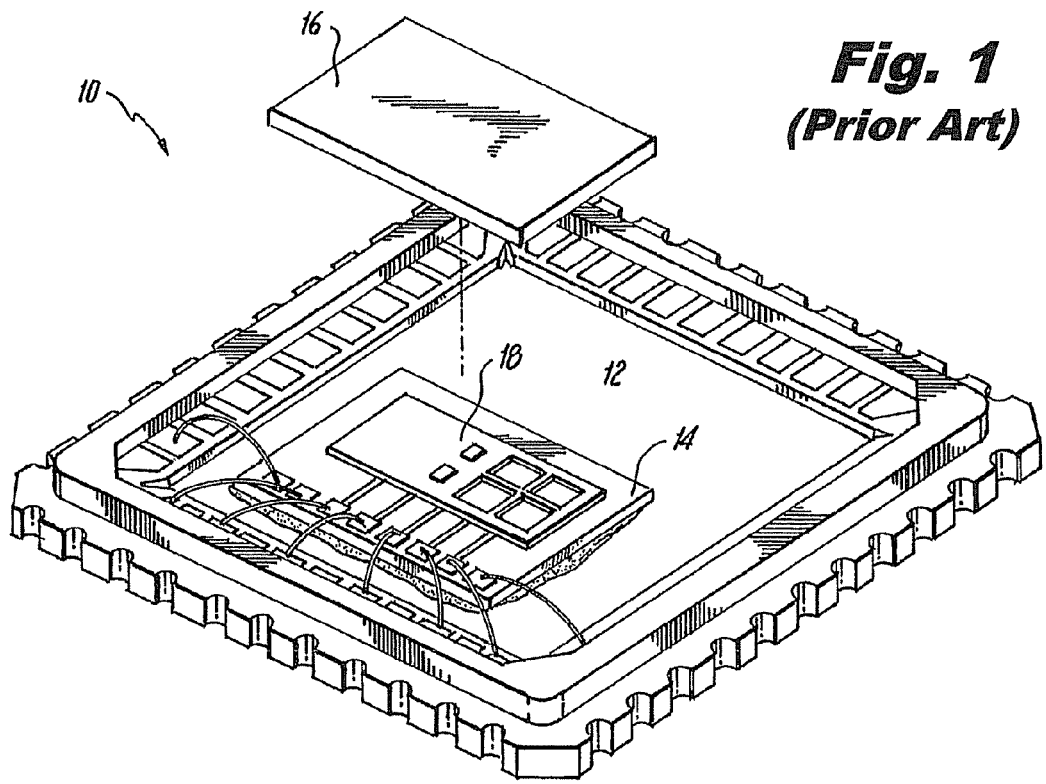
Fig. 1
(Prior Art)
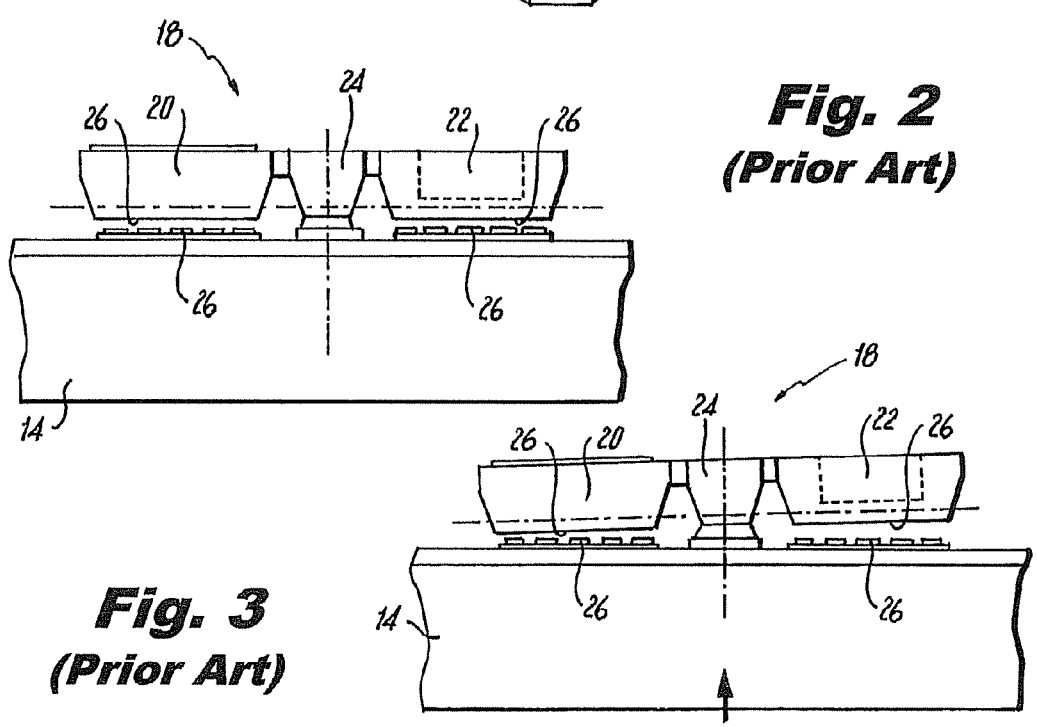
Fig. 2
(Prior Art)
Fig. 3
(Prior Art)

DIE ATTACH STRESS ISOLATION

BACKGROUND OF THE INVENTION

1. Field of the Invention

The present invention relates to microstructure devices, and more particularly to isolating stress sensitive microstructure devices from packaging stress and the like.

2. Description of Related Art

A variety of devices are known in the art for isolating semiconductor dies from packaging stress and the like. Packaging stress or mounting stress is the stress imparted on a semiconductor die by the package to which it is mounted. This can arise due to the semiconductor die having a different coefficient of thermal expansion from the packaging to which it is mounted and/or from the adhesive mounting the die to the package. In such cases, a change in temperature can cause a stress/strain on the semiconductor die, and depending on the function of the die, this stress/strain can impair performance. Packaging stress can also be caused by mechanical mounting effects from how a die is mounted to the package and how the package itself is mounted in its surroundings.

In one example of packaging stress, traditional piezo resistive MEMS pressure sensor packages are designed to sense the stress on a diaphragm due to an applied pressure. It is therefore important that the only stress that the piezo resistors experience is due to the applied pressure and not to packaging stress. In such sensor packages, wherein the MEMS die is typically mounted directly to a metallic package, there can be significant packaging stress due to mechanical mounting stress and thermal expansion stress as explained above. Such sensor packages are inexpensive, but the packaging stress on the diaphragm makes pressure measurement problematic in terms of accuracy.

Another example of how packaging stress can undermine proper functioning of a microstructure device is in MEMS accelerometers where small deflections of a proof mass are measured to determine acceleration. Packaging stress imparted on such devices can induce undesirable deflections between the proof mass and the sensing structures in the device, which can give rise to false readings of acceleration. Other exemplary devices that are negatively affected by packaging stress include MEMS gyros for sensing angular movement, temperature sensors, and the like.

Typical approaches to minimize adverse packaging stress and strain include using a complaint adherence such as soft or elastomeric adhesives. This approach is fairly inexpensive and easy to manufacture and provides partial stress relief, but has certain disadvantages including processing (i.e., curing), out-gassing, inconsistent mechanical properties over temperature, and potential media incompatibility. Other approaches include fixed mounting methods such as fusion, frit, solder, braze, anodic and eutectic attachment. These can provide advantageous media compatibility, more consistent mechanical properties, and can be more robust compared to other techniques, but can cost more, can require specialized processing equipment and processes as well as higher temperature processing, and can be a potential stress inducer. Still other approaches include MEMS structure additions such as springs and mounting pedestal geometries. These techniques offer potential advantages such as springs being integral with the MEMS structure, additional stress relief may not be required, and smaller size potential. However, these techniques have disadvantages including higher development cost compared to other techniques, and mechanical resonance issues that need to be addressed. Often, multiple approaches such as those above are utilized together to address packaging stress.

For example, in some traditional MEMS pressure sensor packages, packaging stress mitigation was achieved by thickening the topping and backing wafers enclosing the diaphragm, adding a high-aspect ratio pedestal between the package and the MEMS die, and using a large, custom package to house it all. These measures have been found to provide an order of magnitude increase in accuracy in measurements made with the sensor packages so configured. However, the stress mitigation features add to the cost and size of the sensor packages.

Such conventional methods and systems have generally been considered satisfactory for their intended purpose. However, there is still a need in the art for microstructure device packages that allow for improvements in packaging stress mitigation. There also remains a need in the art for such devices that are easy to make and use. The present invention provides a solution for these problems.

SUMMARY OF THE INVENTION

The subject invention is directed to a new and useful microstructure device package. The package includes a package housing configured and adapted to house a microstructure device. A bracket is housed in the package housing. The bracket includes a bracket base with a first bracket arm and a second bracket arm each extending from the bracket base. A channel is defined between the first and second bracket arms. The first bracket arm defines a first mounting surface facing inward with respect to the channel. The second bracket arm defines a second mounting surface facing outward with respect to the channel. The second mounting surface of the bracket is mounted to the package housing. A microstructure device is mounted to the first mounting surface in the channel. The bracket is configured and adapted to isolate the microstructure device from packaging stress imparted from the package housing on the second mounting surface of the bracket.

In certain embodiments, the microstructure device includes a topping wafer component and a base wafer component with a stress sensitive component housed therebetween. The topping wafer component is mounted to the first mounting surface of the bracket. The stress sensitive component can be an accelerometer, gyroscope, or other inertial sensor, wherein the accelerometer includes a sensing plate with a first electrode thereon opposed to a second electrode on the base wafer component such that relative movement of the sensing plate and base wafer component results in a change in capacitance across the first and second electrodes.

A clearance can be defined between the second bracket arm and the microstructure device, e.g., between the second bracket arm and the base wafer component of the microstructure device. A clearance can also be defined between the bracket base and the microstructure device, e.g., between the bracket base and the topping and base wafer components of the microstructure device. It is contemplated that the only rigid attachment of the microstructure device to the bracket can be at the first mounting surface of the bracket, e.g., where the topping wafer component is mounted to the first mounting surface of the bracket. It is also contemplated that the only rigid connection of the first and second bracket arms to each other can be by way of the bracket base.

In accordance with another exemplary embodiment, a microstructure device package includes a package housing and a microstructure device having a base portion with a stress sensitive component and a topping wafer mounted to the base portion. The topping wafer of the microstructure device is mounted to the package housing to isolate the base portion and stress sensitive component from packaging stress. The package housing can include a bridge substrate suspended across two posts, or any other suitable number of posts, extending from a surface of the package housing, wherein the topping wafer of the microstructure device is mounted to the bridge substrate.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein:

FIG. 1 is an exploded perspective view of a prior art MEMS device package, showing the topping wafer removed from a MEMS accelerometer;

FIG. 2 is a cross-sectional elevation view of the MEMS accelerometer of FIG. 1, showing the sensing plate and base wafer in a non-accelerating state;

FIG. 3 is a cross-sectional elevation view of the MEMS accelerometer of FIG. 2, showing the sensing plate and base wafer displaced relative to one another as in an accelerating state;

DETAILED DESCRIPTION OF THE PREFERRED EMBODIMENTS

Figure 4:
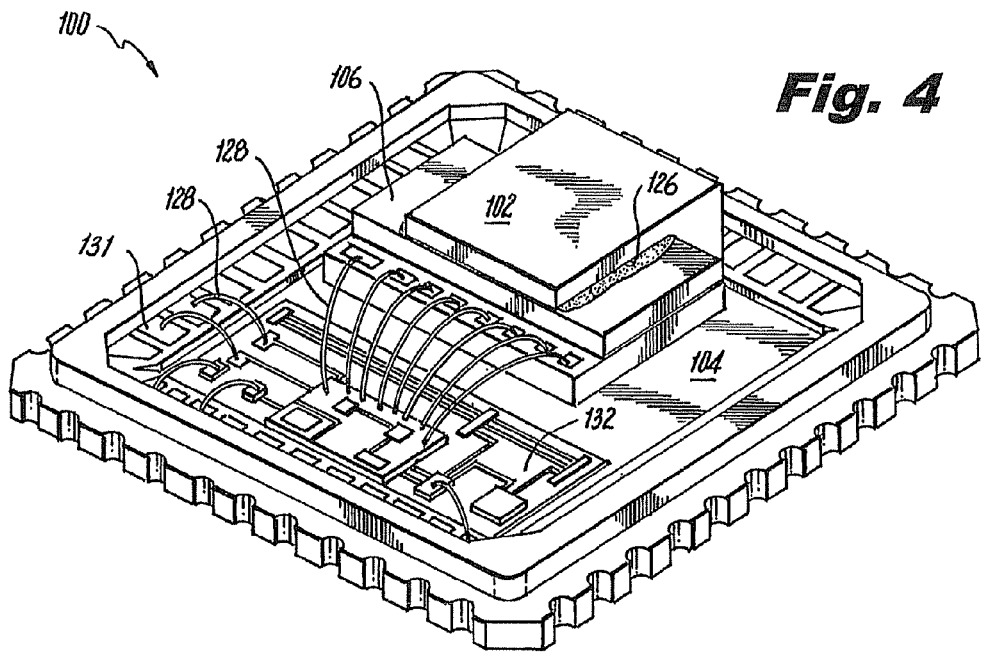
FIG. 4 is a perspective view of an exemplary embodiment of a microstructure device package constructed in accordance with the present invention, showing a microstructure device mounted to the package housing by way of a stress isolating bracket.

Reference will now be made to the drawings wherein like reference numerals identify similar structural features or aspects of the subject invention. For purposes of explanation and illustration, and not limitation, a partial view of an exemplary embodiment of a microstructure device package in accordance with the invention is shown in FIG. 4 and is designated generally by reference character 100. Other embodiments of microstructure device packages in accordance with the invention, or aspects thereof, are provided in FIGS. 5-7, as will be described. The systems and methods of the invention can be used to isolate microstructure devices from packaging stress.

Referring now to FIG. 1, an exemplary MEMS accelerometer 10 is shown as a die mounted in a package 12. The accelerometer 10 includes a base wafer 14, which is mounted directly to the package 12. A topping wafer 16 is mounted to base wafer 14 with a sensing plate 18 housed between the topping and base wafers 16 and 14. FIGS. 2 and 3 show how the operation of sensing plate 18 can provide sensor readings for acceleration. As shown in FIG. 2, when at rest, the proof mass includes a solid side 20 and a hollow side 22 balanced across anchor portion 24. Capacitor electrode plates 26 are formed on the lower face of the proof mass and on the upper face of base wafer 14, as oriented in FIG. 2. In an accelerating frame, as shown in FIG. 3 where the direction of the acceleration is indicated by the heavy arrow, there is a force imbalance that deflects the proof mass, which rotates slightly about anchor portion 24. This deflection changes the spacing between facing capacitor electrode plates 26 of sensing plate 18 and base wafer 14. The corresponding change in capacitance can be monitored to generate a measurement of the acceleration. Further details regarding accelerometers of this type are provided in U.S. Pat. No. 7,736,931 to Guo, which is incorporated by reference herein in its entirety.

Stresses acting on base wafer 14 can cause base wafer 14 to warp slightly. This warping can affect the spacing between the facing capacitor electrode plates 26, and the stress on base wafer 14 can thereby cause false readings of acceleration. One common source of such stress is packaging stress as described above acting between package 12 and base wafer 14 where the two are mounted together.

Referring now to FIG. 4, a microstructure device package 100 includes a bracket 102 for mitigating packaging stress. The package 100 includes a package housing 104 configured and adapted to house a MEMS accelerometer 106, which is a die mounted as described below. Bracket 102 is housed in package housing 104. Package housing 104 includes a cover, which is not shown in order to reveal the structures within.

Figure 5:
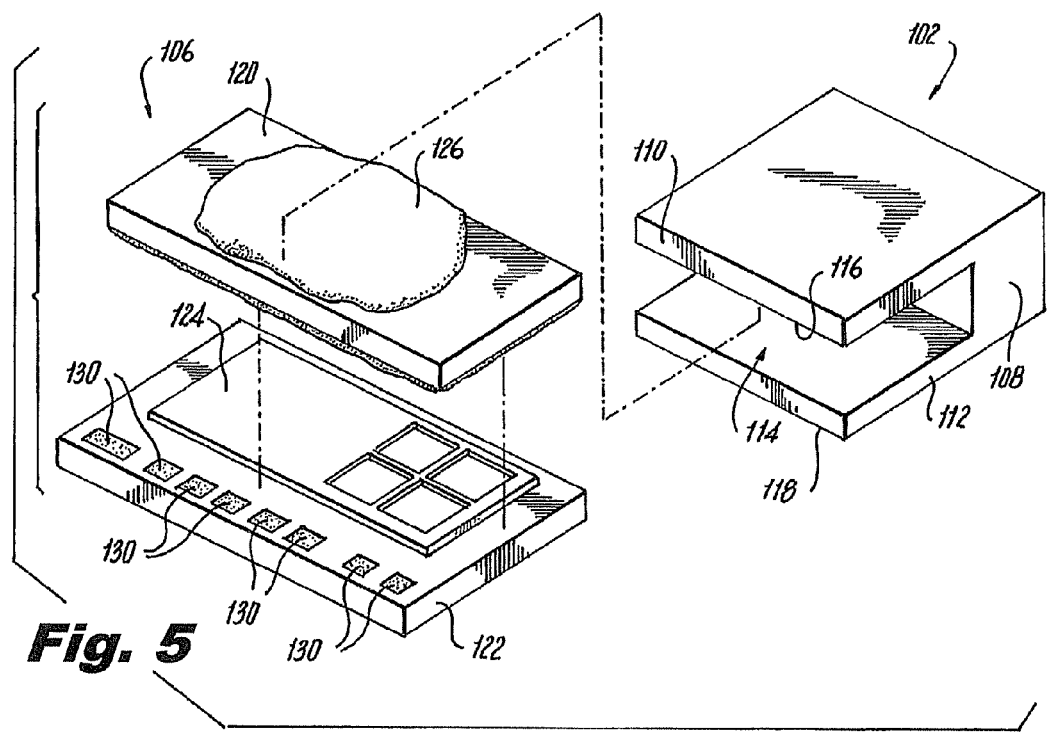
FIG. 5 is an exploded perspective view of the stress isolating bracket and microstructure device of FIG. 4, showing the mounting location for attaching the microstructure device to the bracket.

With reference now to FIG. 5, bracket 102 includes a bracket base 108 with a first bracket arm 110 and a second bracket arm 112 each extending from bracket base 108. A channel 114 is defined between the first and second bracket arms 110 and 112. First bracket arm 110 defines a first mounting surface 116 facing inward with respect to channel 114. Second bracket arm 112 defines a second mounting surface 118 facing outward with respect to channel 114. Second mounting surface 118 of bracket 102 is mounted to package housing 104 as shown in FIG. 4. MEMS accelerometer 106 is mounted to first mounting surface 116 in channel 114.

MEMS accelerometer 106 includes a topping wafer component 120 and a base wafer component 122 with a stress sensitive component, namely electrodes and sensing plate 124 much like sensing plate 18 described above, housed therebetween. Topping wafer component 120 is mounted to first mounting surface 116 the bracket 102, as indicated by the adhesive 126 shown in FIGS. 4 and 5. Adhesive 126 can be silver filled epoxy or any other suitable material. Wire bonds 128 electrically connect between contacts 130 of MEMS accelerometer 106 to optional on board electronics 132, which are in turn connected to contacts 131 of package housing 104 for communication of electrical signals indicative of acceleration to external components.

Figure 6:
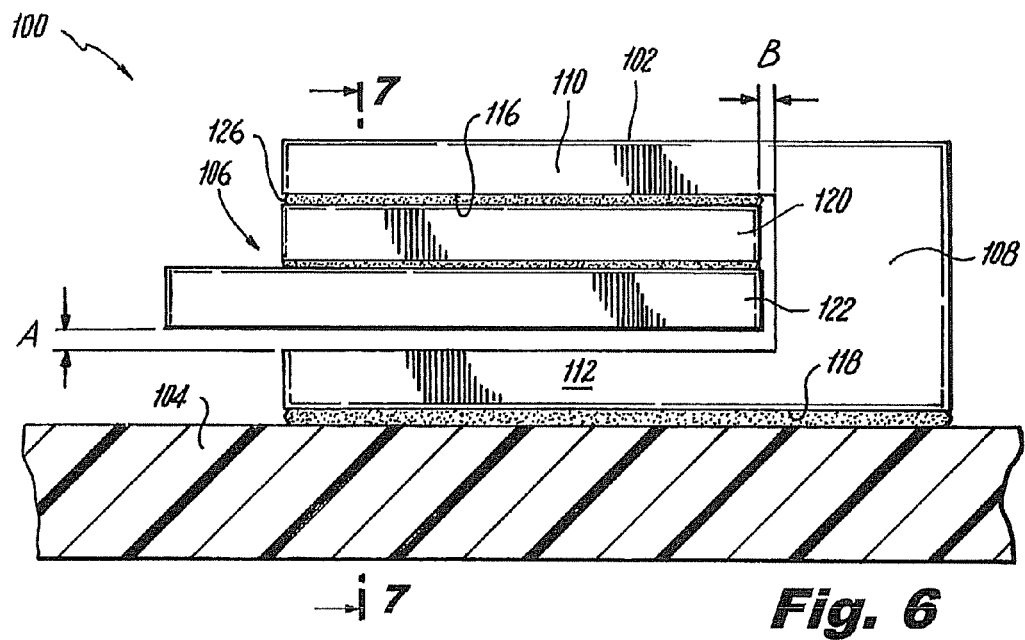
FIG. 6 is a front elevation view of a portion of the microstructure device package of FIG. 4, showing the clearances between the stress isolating bracket and the microstructure device.
Figure 7:
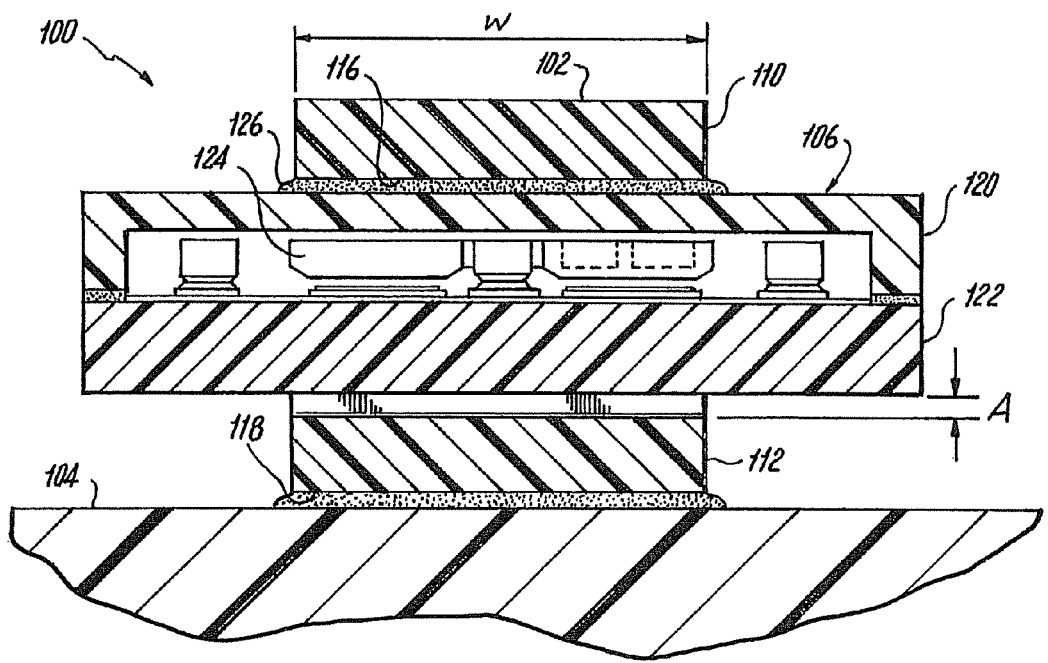
FIG. 7 is a cross-sectional side elevation view of the portion of the microstructure device package indicated in FIG. 6, showing the MEMS accelerometer housed within the topping and base wafer components of the microstructure device.

Referring now to FIGS. 6-7, bracket 102 is configured and adapted to isolate the MEMS accelerometer 106 from packaging stress imparted from package housing 104 on second mounting surface 118 of bracket 102. A clearance A is defined between second bracket arm 112 and the MEMS accelerometer 106, i.e., between second bracket arm 112 and base wafer component 122 of the MEMS accelerometer 106. A second clearance B, indicated in FIG. 6, is defined between bracket base 108 and MEMS accelerometer 106, i.e., between bracket base 108 and the topping and base wafer components 120 and 122 of MEMS accelerometer 106. Thus the only rigid attachment of MEMS accelerometer 106 to bracket 102 is at the first mounting surface 116 of bracket 102, i.e., where topping wafer component 120 is mounted to first mounting surface 116 by adhesive 126. It is also notable that bracket 102 has a generally c-shaped cross-section as shown in FIG. 6, with the only rigid connection of the first and second bracket arms 110 and 112 to each other being by way of bracket base 108.

In this configuration, base wafer 122 and the stress sensitive components associated therewith, such as sensing plate 124 shown in FIG. 7, are isolated from any stress imparted by package housing 104 because of the intervening topping wafer component 120, first bracket arm 110, bracket base 108, and second bracket arm 112 connecting between the source of the stress and the stress sensitive components. In other words, since base wafer component 122 is not directly affixed to package housing 104, little or no stress from package housing 104 can affect the spacing of the capacitor electrode plates to cause false readings.

This stress-mitigating structure allows for greater sensitivity and reliability of the sensor readings from MEMS accelerometer 106, which can be demonstrated to provide a substantial bias and scale factor repeatability improvement. Bracket 102 can advantageously be made of a material having a thermal expansion coefficient matching that of topping wafer component 120 to reduce thermal expansion differentials. For example, both bracket 102 and topping wafer component 120 can be made of silicon, where channel 114 can be formed with a dicing saw, silicon etching, or any other suitable method. Those skilled in the art will readily appreciate that any suitable materials and mounting methods can be used without departing from the spirit and scope of the invention.

The width W of bracket 102 can have an effect on stress isolation. Generally, the smaller the width W, the greater the degree of stress isolation is achieved. This is due in part to the more favorable aspect ratios provided by smaller width pedestals. This is also due at least in part to thermal expansion differentials between the material of adhesive 126 and the materials of the bracket 102 and topping wafer component 120.

Figure 8:
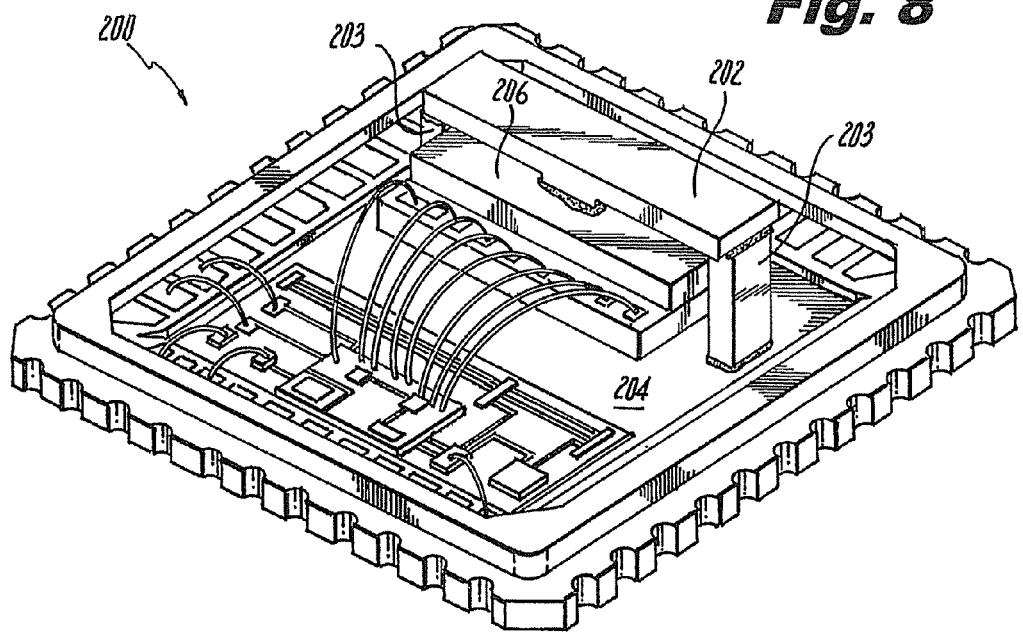
FIG. 8 is a perspective view of another exemplary embodiment of a microstructure device package constructed in accordance with the present invention, showing a microstructure device mounted to the package housing by way of a bridge substrate suspended between two posts.
Figure 9:
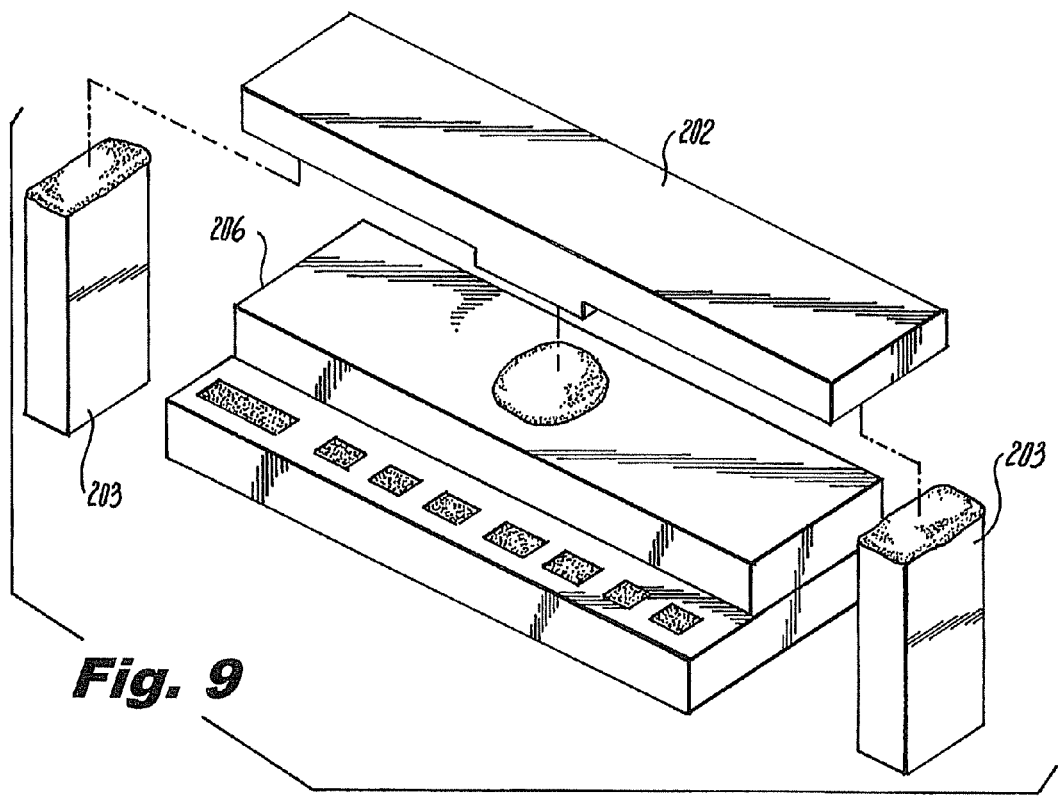
FIG. 9 is an exploded perspective view of the microstructure device, bridge substrate, and posts of FIG. 8.
Figure 10:
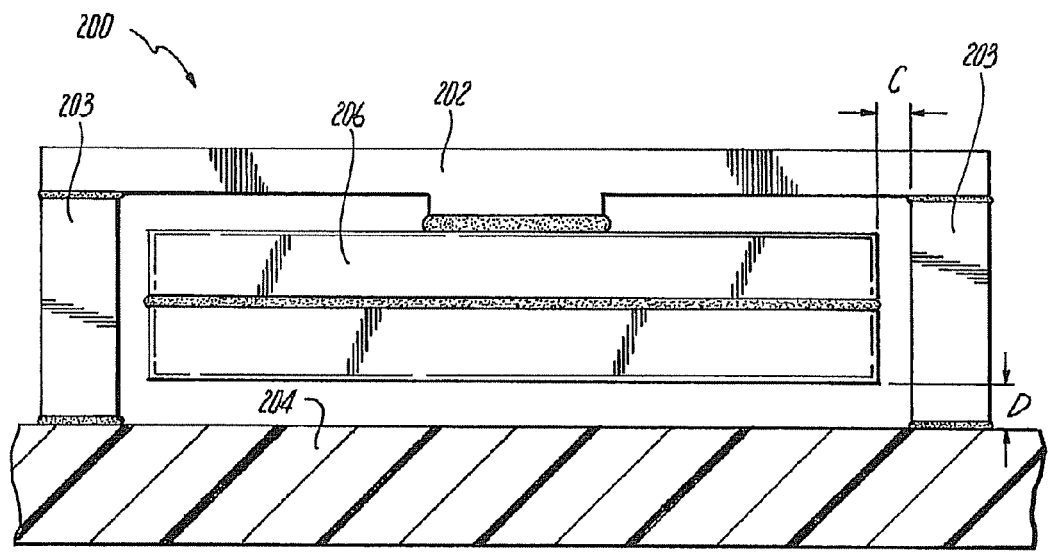
FIG. 10 is a side elevation view of the microstructure device package of FIG. 8, showing the gaps between the microstructure device and the posts and package housing.

With reference now to FIG. 8, another exemplary microstructure device package 200 includes a MEMS accelerometer 206 much as MEMS accelerometer 106 described above. MEMS accelerometer 206 is suspended by its topping wafer from a bridge substrate 202 that spans across two posts 203 extending from a surface of the package housing 204. Any other suitable number of posts 203 can be used. This bridge structure provides stress isolation for stress sensitive components within MEMS accelerometer 206 in much the same manner as bracket 102 described above. As indicated schematically in FIG. 9, the bridge structure also provides manufacturing advantages since it can be fabricated using standard automated manufacturing equipment. MEMS accelerometer 206 is adhered or otherwise connected to bridge substrate 202 prior to mounting to package housing 204. In a potentially parallel process, posts 203 are attached or formed on package housing 204. The bridge substrate can then be mounted to span from post 203 to post 203 with MEMS accelerometer 206 already attached. As shown in FIG. 10, the resulting structure provides a gap C between MEMS accelerometer 206 and each post 203, and a gap D between MEMS accelerometer 206 and the package housing, similar to gaps A and B described above.

Figure 11:
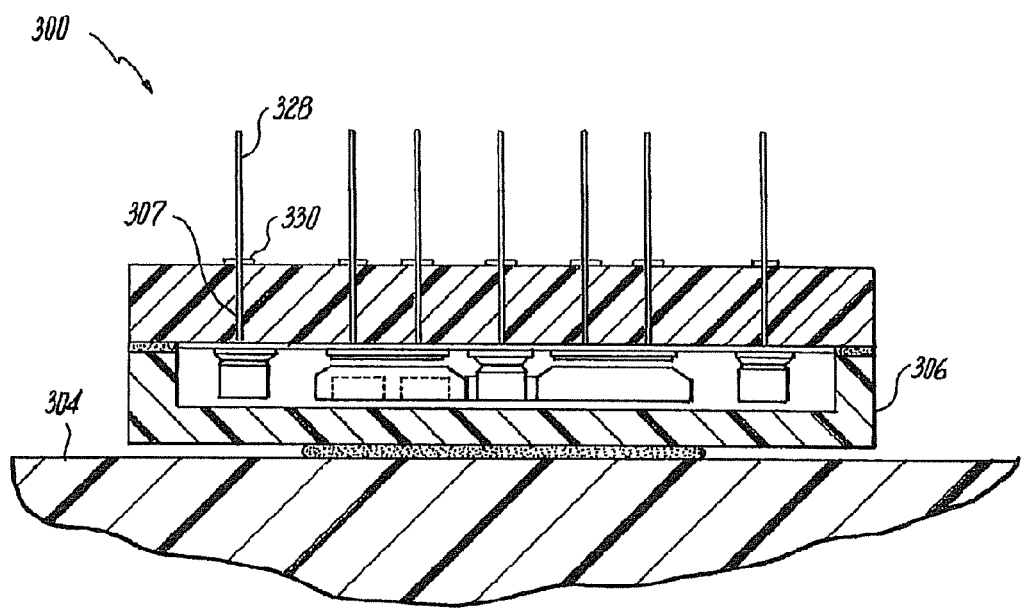
FIG. 11 is a cross-sectional elevation view of another exemplary embodiment of a microstructure device package constructed in accordance with the invention, showing a microstructure device with its topping substrate adhered to the package housing.

Referring now to FIG. 11, another exemplary embodiment of a microstructure device package 300 includes a MEMS accelerometer 306 similar to those described above, having its topping wafer adhered or otherwise mounted directly to package housing 304, i.e., MEMS accelerometer 306 is inverted relative to the embodiment shown in FIG. 7, for example. It is also contemplated that an interposer component could be mounted between package housing 304 and the topping wafer. Mounting MEMS accelerometer 306 by its topping wafer isolates the base portion and stress sensitive components within MEMS accelerometer 306 from packaging stress, which cannot act directly on the base portion of MEMS accelerometer. To facilitate electrical connection of MEMS accelerometer 306 to other components, through-silicon-vias 307 are formed in the base portion, connecting the components within MEMS accelerometer 306 to electrical wire bond pads 330 on the outside of MEMS accelerometer 306, to which wire bonds 328 can be connected.

The systems and methods of the invention have been described herein in the exemplary context of MEMS accelerometers. Nonetheless, it will be readily apparent to those skilled in the art that the systems and methods described herein can be applied with great advantage to other microstructure dies and devices, such as pressure sensors, gyros, other inertial sensors, or any other suitable types of devices without departing from the spirit and scope of the invention.

The methods and systems of the present invention, as described above and shown in the drawings, provide for microstructure device packages with superior properties including packaging stress isolation for stress sensitive microstructure devices. While the apparatus and methods of the subject invention have been shown and described with reference to preferred embodiments, those skilled in the art will readily appreciate that changes and/or modifications may be made thereto without departing from the spirit and scope of the subject invention.

What is claimed is:

1. A microstructure device comprising:
   a bracket having a bracket base and including a first bracket arm and a second bracket arm each extending from the bracket base with a channel defined therebetween, the first bracket arm defining a first mounting surface facing inward with respect to the channel, the second bracket arm defining a second mounting surface facing outward with respect to the channel; and
   a microstructure device mounted to the first mounting surface in the channel, wherein the bracket is configured and adapted to isolate the microstructure device from packaging stress imparted on the second mounting surface,
   wherein the microstructure device is rigidly attached to the bracket only at the first mounting surface of the bracket.

2. A microstructure device as recited in claim 1, wherein the microstructure device includes a topping wafer component and a base wafer component with a stress sensitive component housed therebetween, wherein the topping wafer component is mounted to the first mounting surface of the bracket.

3. A microstructure device as recited in claim 1, wherein a clearance is defined between the second bracket arm and the microstructure device.

4. A microstructure device as recited in claim 1, wherein a clearance is defined between the bracket base and the microstructure device.

5. A microstructure device as recited in claim 1, wherein the microstructure device includes a topping wafer component and a base wafer component with an inertial sensor housed therebetween, wherein the inertial sensor includes a sensing plate with a first electrode thereon opposed to a second electrode on the base wafer component such that relative movement of the sensing plate and base wafer component results in a change in capacitance across the first and second electrodes, wherein the topping wafer component is mounted to the first mounting surface of the bracket.

6. A microstructure device as recited in claim 5, wherein a clearance is defined between the second bracket arm and the base wafer component of the microstructure device.

7. A microstructure device as recited in claim 5, wherein a clearance is defined between the bracket base and the topping and base wafer components microstructure device.

8. A microstructure device as recited in claim 5, wherein the microstructure device is rigidly attached to the bracket only where the topping wafer component is mounted to the first mounting surface of the bracket.

9. A microstructure device package comprising:
a package housing configured and adapted to house a microstructure device;
a bracket housed in the package housing, the bracket having a bracket base and including a first bracket arm and a second bracket arm each extending from the bracket base with a channel defined therebetween, the first bracket arm defining a first mounting surface facing inward with respect to the channel, the second bracket arm defining a second mounting surface facing outward with respect to the channel, wherein the second mounting surface of the bracket is mounted to the package housing; and
a microstructure device mounted to the first mounting surface in the channel, wherein the bracket is configured and adapted to isolate the microstructure device from packaging stress imparted from the package housing on the second mounting surface of the bracket.

10. A microstructure device package as recited in claim 9, wherein the microstructure device includes a topping wafer component and a base wafer component with a stress sensitive component housed therebetween, wherein the topping wafer component is mounted to the first mounting surface of the bracket.

11. A microstructure device package as recited in claim 9, wherein a clearance is defined between the second bracket arm and the microstructure device.

12. A microstructure device package as recited in claim 9, wherein a clearance is defined between the bracket base and the microstructure device.

13. A microstructure device package as recited in claim 3, wherein the microstructure device is rigidly attached to the bracket only at the first mounting surface of the bracket.

14. A microstructure device package as recited in claim 9, wherein the microstructure device includes a topping wafer component and a base wafer component with an inertial sensor housed therebetween, wherein the inertial sensor includes a sensing plate with a first electrode thereon opposed to a second electrode on the base wafer component such that relative movement of the sensing plate and base wafer component results in a change in capacitance across the first and second electrodes, wherein the topping wafer component is mounted to the first mounting surface of the bracket.

15. A microstructure device package as recited in claim 14, wherein a clearance is defined between the second bracket arm and the base wafer component of the microstructure device.

16. A microstructure device package as recited in claim 14, wherein a clearance is defined between the bracket base and the topping and base wafer components of the microstructure device.

17. A microstructure device package as recited in claim 14, wherein the microstructure device is rigidly attached to the bracket only where the topping wafer component is mounted to the first mounting surface of the bracket.

18. A microstructure device package comprising a package housing and a microstructure device having a base portion with a stress sensitive component and a topping wafer mounted to the base portion, wherein the topping wafer of the microstructure device is mounted to the package housing to isolate the base portion and stress sensitive component from packaging stress,
wherein the package housing includes a bridge substrate suspended across a plurality of posts extending from a surface of the package housing, wherein the topping wafer of the microstructure device is mounted to the bridge substrate.

* * * * *